United States Patent
Cai et al.

(10) Patent No.: US 6,855,609 B2
(45) Date of Patent: Feb. 15, 2005

(54) METHOD OF MANUFACTURING ESD PROTECTION STRUCTURE

(75) Inventors: Jun Cai, Singapore (SG); Guang Ping Hua, Singapore (SG); Jun Song, Singapore (SG); Keng Foo Lo, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/670,918

(22) Filed: Sep. 24, 2003

(65) Prior Publication Data

US 2004/0058502 A1 Mar. 25, 2004

Related U.S. Application Data

(62) Division of application No. 09/733,836, filed on Dec. 9, 2000.

(51) Int. Cl.⁷ ............................................. H01L 21/336
(52) U.S. Cl. ...................... 438/294; 438/197; 438/309
(58) Field of Search ............................... 438/197, 294, 438/309

*Primary Examiner*—Long Pham
(74) *Attorney, Agent, or Firm*—Mikio Ishimaru

(57) ABSTRACT

A transistor structure is manufactured for ESD protection in an integrated circuit device. A semiconductor substrate has source and drain diffusion regions and respective source and drain wells under the source and drain diffusion regions. A shallow trench isolation formed over the semiconductor substrate and into the semiconductor substrate separates the source and drain diffusion regions and a portion of the source and drain wells. Source and drain contact structures respectively formed on the shallow trench isolation over the source and drain diffusion regions and extend through the shallow trench isolation to contact the source and drain diffusion regions. An ion implantation is performed through the contact openings into the bottoms of the source and drain wells to control the device trigger voltage and position the discharge current far away from the surface, which increases the device ESD performance significantly.

8 Claims, 1 Drawing Sheet

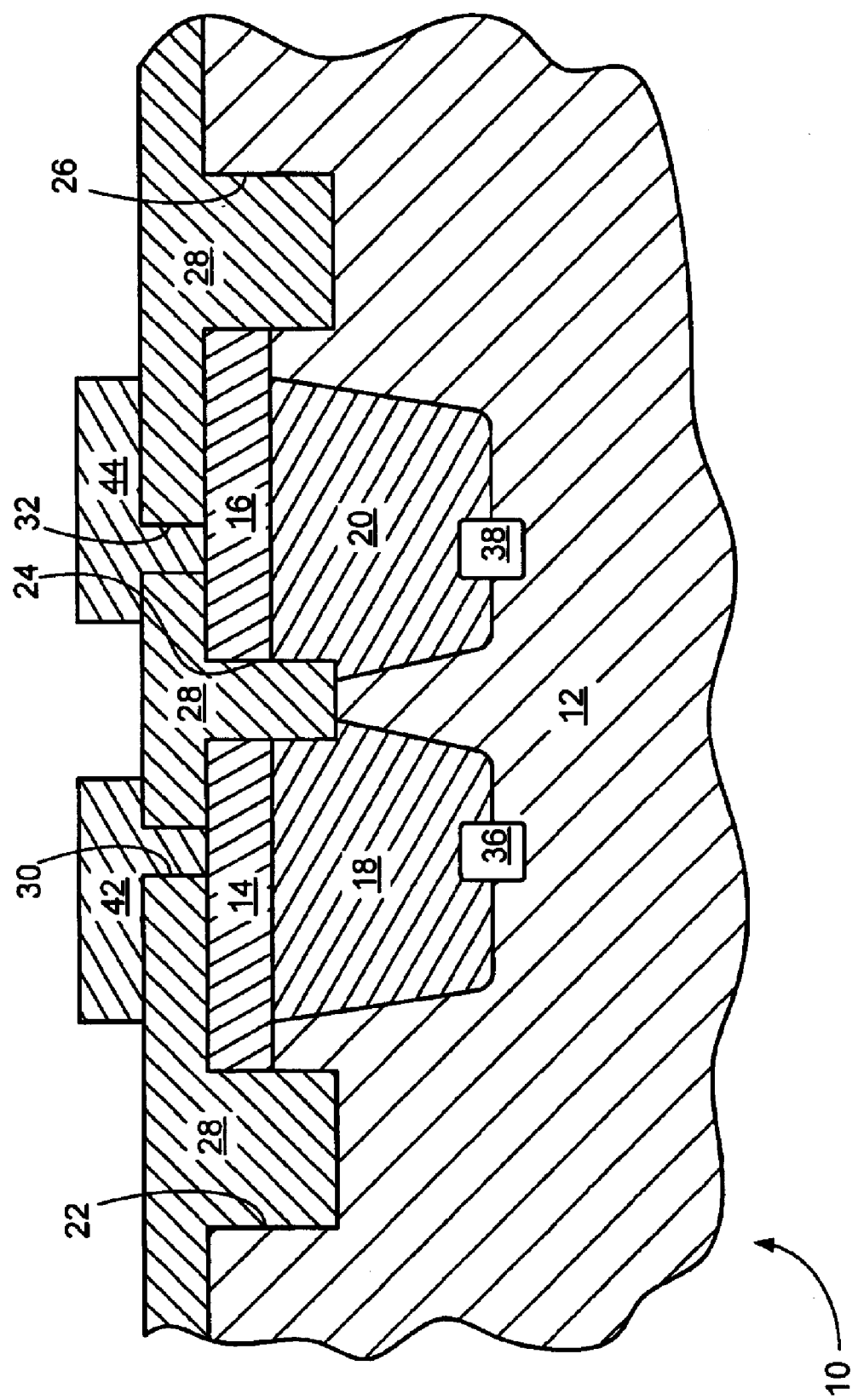

METHOD OF MANUFACTURING ESD PROTECTION STRUCTURE

CROSS-REFERENCE TO RELATED APPLICATION

This is a divisional of co-pending application Ser. No. 09/733,836, filed Dec. 9. 2000.

TECHNICAL FIELD

The present invention relates to electrostatic discharge (ESD) protection structures and more particularly to ESD protection transistor structures for deep quarter-micron line geometries.

BACKGROUND OF THE INVENTION

Electrostatic discharges (ESDs) are high-voltage spikes of static charges which damage modern integrated circuits. ESDs are a significant failure mechanism, particularly as integrated circuit physical dimensions continue to shrink to the deep quarter-micron range.

Electrically, an ESD occurs upon contact of one or more of the terminals of an integrated circuit with a body or material that is statically charged to a high voltage. This level of static charge is readily generated by the triboelectric effect, and other mechanisms acting upon humans, equipment, or the circuits themselves. Upon contact, the integrated circuit discharges through its active devices and DC current paths. If the amount of charge is excessive however, the discharge current density can permanently damage the integrated circuit so that it is no longer functional or so that it is more prone to later-life failure. ESD damage thus is a cause of yield loss in manufacturing and also poor reliability in use.

In the past, n-type metal oxide semiconductor (NMOS) transistors have been widely used as the primary component in ESD protection circuits in semiconductor integrated circuit devices. Under ESD stress conditions, the NMOS transistor behavior changes drastically from normal operation. The actual conduction mechanism is that of bipolar action in the parasitic lateral bipolar structure.

In advanced manufacturing processes with transistors having lightly doped drain (LDD) junctions, the NMOS performance is limited because the peak heating occurs close to the surface, which has poor thermal conductivity. Therefore, an ESD implant has to be used to make the junction deeper as well as to overdope the lightly doped region of the LDD for improved ESD performance.

It is also well known that salicidation (self-aligned siliciding) of the drain and source junctions reduces ESD performance significantly due to discharge current localization. From the ESD viewpoint, the primary effect of the salicidation is to bring a transistor drain or a source contact closer to its diffusion edge near their respective gate edge. The consequence is that under high current conditions, the ballasting resistance between the drain or the source contact and their respective gate edge is reduced and the short current path cause "hot spot" formation, usually at the gate edge. Once a hot spot is formed, there is very little resistance to prevent current localization through the hot spot and so most of the current flows through the silicide to the gate edge. This leads to higher power dissipation and damage in this region. Also, the high power dissipation through the drain or source silicide can cause damage at the drain or source contact when the eutectic temperature is exceeded.

The most conventional solution to the salicidation problem is called a "salicide block". Most salicidation fabrication technology processes have a "salicide block" option, which is an additional photolithographic process step to block the formation of silicide in areas close to a transistor's gate edge. Without the gate edge silicide, an ESD implantation is required make the drain junction deeper as well as to overdope the lightly doped region of the LDD for better ESD performance. Since the ESD implantation is undesirable in the circuitry being protected, an ESD implant block would be required over the non-ESD circuitry. Thus, this approach adds to process complexity because it requires at least two additional photolithographic process steps; i.e., the silicide block and the ESD implant block.

In the parasitic lateral bipolar structure of the NMOS transistor, the majority of the electrons reaching the collector junction are emitted from the emitter junction sidewall, which results in a very small "intrinsic" base area. The high current is confined to a very small region of the emitter and base regions that will lead to a large power density in these regions and hence higher temperatures.

Substrate current initially needs to forward-bias a small region of the source-substrate junction to turn-on the bipolar action. However, for better ESD performance, a larger emitter area is preferred. This will be particularly effective if the source barrier lowering occurs deeper in the junction, allowing the power dissipation to take place deeper in the device to reduce the temperature rise in the device.

One normal way to provide ESD protection is to use a grounded gate thin oxide n-type MOS (GGNMOS) transistor. In the GGNMOS transistor, the voltage necessary to turn the transistor on (the turn-on voltage) is reached by the occurrence of an avalanche breakdown. Unfortunately, as these transistors continue to shrink in size down to the deep-quarter-micron geometry level, the avalanche breakdown becomes so high that the gate oxide breakdown voltage approaches the turn-on voltage. Thus, the protection window tends to go to zero and at a small enough geometry will provide no protection at all.

Briefly, there are a large number of issues related to ESD protection structures. Is it possible to remove or reduce the ESD process steps for reducing process cost? Is it possible to reduce the ESD adjustment cycle time or make the ESD adjustment flexible process? Is it possible to increase the parasitic "intrinsic" emitter area and make the source barrier flowing occur deeper in the junction? Can the thin oxide for ESD reliability be removed while making the structure easily turned on? Is it possible to reduce the trigger-on voltage of the structure?

It is critical that a new form of ESD protection structure be developed which provides solves the above questions in order to progress to smaller integrated circuit geometries that are compatible with saliciding technology without adding process complexity or cost.

DISCLOSURE OF THE INVENTION

The present invention provides a method for manufacturing an electrostatic discharge protection transistor structure for ESD protection in an integrated circuit device. A semiconductor substrate is implanted with source and drain diffusion regions and then with source and drain wells under the source and drain diffusion regions. A shallow trench opening is formed in the semiconductor substrate between the source and drain diffusion regions and a portion of the source and drain wells followed by forming a shallow trench isolation over the semiconductor substrate and in the shallow trench opening in the semiconductor substrate to separate the source and drain diffusion regions and a portion of the source and drain wells. Source and drain contact structures are then formed on the shallow trench isolation respectively over the source and drain diffusion regions and through the shallow trench isolation to contact the source and drain diffusion regions. This method forms a large parasitic "intrinsic" emitter area and makes the source barrier lowering occur deep in the source well.

The present invention further provides a method of manufacture for an ESD protection structure in an integrated circuit device that has a reduced ESD adjustment cycle time which is flexible in process.

The present invention further provides a method of manufacture for an ESD protection structure in an integrated circuit device that does not use thin oxide and which is easily turned-on.

The present invention further provides a method of manufacture for an ESD protection structure in an integrated circuit device that has a low trigger-on voltage for sub-deep-quarter-micron process applications.

The above and additional advantages of the present invention will become apparent to those skilled in the art from a reading of the following detailed description when taken in conjunction with the accompanying drawings.

BRIEF DESCRIPTION OF THE DRAWINGS

The drawing is a cross-sectional schematic of a semiconductor structure of the present invention.

BEST MODE FOR CARRYING OUT THE INVENTION

Structure

Referring now to the drawing, therein is shown an electrostatic discharge (ESD) protection structure 10. The ESD protection structure 10 includes a semiconductor substrate 12, preferably a p-substrate.

The term "horizontal" as used in herein is defined as a plane parallel to the conventional plane or surface of the semiconductor substrate 12, regardless of the orientation of the semiconductor substrate12. The term "vertical" refers to a direction perpendicular to the horizontal as just defined. Prepositions, such as "on", "below", "above", "lower", "over", and "under" are defined with respect to the conventional plane or surface being on the top surface of the semiconductor substrate 12, regardless of the orientation of the semiconductor substrate 12.

The semiconductor substrate 12 has a source diffusion region 14, preferably of an n+ conductivity, and a drain diffusion region 16, also preferably of an n+ conductivity, implanted below its top surface. Below the source and drain diffusion regions 14 and 16 are respective deep well source and drain junctions 18 and 20, which are preferably n-wells. The deep well source and drain junctions 18 and 20 are spaced apart horizontally.

The semiconductor substrate 12 has three shallow trench isolation openings 22, 24, and 26 formed therein. The shallow trench isolation openings isolate the source and diffusion regions 14 and 16 from other devices, and the shallow trench isolation opening 24 separates the source and diffusion regions 14 and 16 and a portion of the deep well source and drain junctions 18 and 20. The deep well source and drain junctions 18 and 20 extend below the shallow trench isolation opening 24 in such a way that the proximate edges form a long parasitic "intrinsic" base length between the bottom of the shallow trench isolation opening 24 and the bottom of the deep well source and drain junctions 18 and 20.

The shallow trench isolation 28 has contact openings 30 and 32 which expose the semiconductor substrate 12 above the source and drain diffusion regions 14 and 16. The contact openings 30 and 32 are used to form respective source and drain implants 36 and 38. The implants are of an opposite conductivity, preferably p-type to that of the deep well source and drain junctions 18 and 20 and bridge the deep well and source drain junctions 18 and 20 to the semiconductor substrate 12. The source and drain implants 36 and 38 reduce the junction break down voltage between the deep well source and drain junctions 18 and 20 and the semiconductor substrate 12 to provide a low trigger-on voltage. The source and drain implants 36 and 38 reduce the break down voltage of a p-n junction that is inversely proportional to the substrate impurity concentration. The implant increases the substrate impurity concentration at the p-n junctions between the ESD protection device active regions and the semiconductor substrate 12, and thus decreases the junction break down voltage. The reduction in junction break down voltage improves the ESD characteristics of the device, since it allows more current to be discharged through the ESD protection structure 10 for a given amount of power.

The shallow trench isolation openings 22, 24, and 26 are filled by an insulator material which forms a shallow trench isolation 28. The combination of the shallow trench isolation 28 and the shallow trench isolation opening 24 and the deep well source and drain junctions 18 and 20 form a Field Oxide Device (FOD).

A source metal structure 42 and a drain metal structure 44 are disposed to extend through respective contact openings 30 and 32 in the shallow trench isolation 28 to contact the source and drain diffusion regions 14 and 16, respectively.

Manufacture

In the manufacture of the ESD protection structure 10, the shallow trench isolation openings 22, 24, and 26 are formed by conventional STI etching techniques in the p-doped silicon substrate 12. The deep well source and drain junctions 18 and 20 are implanted with a spacer in between to maintain separation of the two n-wells. The substrate 12 is then implanted with the source and drain diffusion regions 14 and 16, which could be done as a single implantation without separation.

As indicated previously, by having the deep well source and drain junctions 18 and 20 extend deeply into the semiconductor substrate 12, the ESD performance of the ESD protection structure 10 is improved because of the large parasitic "intrinsic" base area formed. Further the horizontal spacing between the deep well source and drain junctions 18 and 20 may be controlled by both the profiling of the implantation as well as the depth of the shallow trench isolation opening 24. As compared with the FOD, the channel length can be designed to be close to its minimum value for efficient turn on. In general, from the layout design, the bipolar turn-on time of the device is determined by this horizontal spacing.

The shallow trench isolation 28 is deposited to fill the shallow trench isolation openings 22, 24, and 26.

Subsequently, the isolation 28 is photolithographically patterned, exposed, and developed to form the contact openings 30 and 32. Since the discharge current flows vertically into the n-well, no discharge current localization in the silicide clad occurs and the silicide block mask is not required.

Usually, ESD characteristics are adjusted before the start of contact formation. However, in the ESD protection structure 10, a light ion implantation is performed between contact formation steps. The light ion implantation is performed through the contact openings 30 and 32 into the active regions of the ESD protection structure 10 to form the respective source and drain implants 36 and 38. The source and drain implants 36 and 38 reduce the junction break down voltage between the n-well and p-substrate to provide a low trigger-on voltage. The source and drain implants 36 and 38 increase the substrate impurity concentration at the p-n junctions and, thus, decrease the junction break down voltage. This lower current implant, which is used to form the source and drain implants 36 and 38, allows for product ESD adjustment cycle time to be shortened.

Because the adjustment of the ESD characteristics can be after the start of contact formation, as opposed to the extra implant step as required in the conventional process, the ESD adjustment cycle time is more flexible.

Thereafter, the contact structures 42 and 44 are deposited to fill the contact openings 30 and 32, and are patterned and etched into their final configurations.

Operation

When an ESD pulse is conducted at the deep well drain junction 20 to semiconductor substrate 12, break down in the deep well drain junction 20 can occur at a low value and deep at the bottom of the deep well drain junction 20. After the deep well drain junction 20 to semiconductor substrate 12 break down, the whole current will be injected into the semiconductor substrate 12 and produce a potential in it which will make the semiconductor substrate 12 to n-well source junction 18 forward biased. Due to the source implant 36, the source barrier lowering occurs deeper in the deep well source junction 18. Thus, the thin gate oxide for ESD reliability is no longer required, and the shallow trench isolation 28 between the deep well source and drain junctions 18 and 20 controls the base length of the parasitic bipolar structure. Therefore, with the gradual profiles of the deep well source and drain junctions 18 and 20, the ESD protection structure 10 can be turned on by a parasitic n-p-n bipolar mode at a low level turn-on voltage and a very large parasitic emitter area.

N-type MOSFETs, herein referred to as NMOS FETs, either fabricated in gate-grounded or gate-coupled configuration, have been widely utilized as the primary component of ESD protection circuits in semiconductor IC devices. NMOS FETs used as the key protection elements of ESD protection circuits provide ESD-sustaining capability through a phenomenon known as a high-voltage snap-back mechanism. This snap-back mechanism provides for the safe conduction of the enormous electric current arising from an ESD event between the transistor drain and source regions.

In the beginning stages of an ESD event, a high electric field intensity is established across the transistor drain junction, resulting in an impact ionization phenomenon which produces both electron and hole carriers. The hole carriers are responsible for a local electric potential established in the p-substrate, as they flow toward a Vss connected contact. When the electric potential accumulated in this region becomes significantly higher than that of the potential of a n+ source region, the source junction becomes forward biased. This forward-biased source junction then injects the electron carriers farther into the p-substrate. As the injected electron carriers are collected by the drain well, the NMOS FET eventually enters a low-resistance (snapback) status, and the excessive ESD current is then released.

As the current flowing from the drain to the source increases, if discharge current flows laterally near the interface between silicon and isolation, current constriction eventually arises due to poor heat conductivitiy near the interface. This forces the ESD current to travel along several narrow passages between the drain and the source junctions, flowing through the weakest spots beneath the transistor gate. High current density flowing along the narrowed and constricted discharge passages inevitably leads to excessive heating, and more carriers are produced as a result. Regions in the device where the temperature rises above the melting point of silicon or aluminum would then suffer permanent damage, particularly in the silicon substrate surface or at the contacts.

Discharge current arising from an ESD event that flows vertically and uniformly from transistor drain region to source region and which spreads along the entire junction areas is the current pattern that provides the best ESD protection. If there is any weak spot, a non-uniformity, for example, which constricts discharge current near the substrate surface, breakdowns would result first in the drain diffusion region proximate to that weak spot. Current constriction would arise in the region of the weak spot, resulting in permanent damage of the device experiencing the ESD current.

The break down point of the ESD protection structure 10 is made very far away from the semiconductor substrate 12 surface. In this situation, the ESD protection structure 10 operates in a bipolar mode with a very effective discharge path to bypass the ESD stress.

In summary, the snap back of the ESD protection structure 10 can be controlled very far away from the silicon surface for ESD reliability and the ESD protection structure 10 will also have a very large cross-sectional area for effective discharge current path. In this case, the trigger voltage and the snap back holding voltage of the ESD protection structure 10 can be reduced. Therefore, it is ideal for improved ESD protection to control the trigger voltage much lower than the onset of the second break down. With ESD adjustment flexible and process and reduced ESD adjustment cycle time and cost, the ESD protection structure 10 is also compatible with self-aligning silicide fabrication and deep quarter-micron technology. It is also known that salicitation of the drain region reduces ESD performance significantly due to the discharge current localization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method for manufacturing an electrostatic discharge protection structure comprising the steps of:

providing a semiconductor substrate;

forming a shallow trench opening in the semiconductor substrate implanting source and drain diffusion regions in the semiconductor substrate;

implanting source and drain wells respectively under the source and drain diffusion regions in the semiconductor substrate;

forming a shallow trench isolation over the semiconductor substrate and in the shallow trench opening in the semiconductor substrate to separate the source and drain diffusion regions and a portion of the source and drain wells; and forming source and drain contact structures on the shallow trench isolation respectively over the source and drain diffusion regions and through the shallow trench isolation to contact the source and drain diffusion regions.

2. The method for manufacturing an electrostatic discharge protection structure as claimed in claim 1 wherein the step of:

implanting the source and drain wells implants source and drain wells of a first conductivity type; and including a step of:

implanting a source and a drain implant of a second conductivity type individually bridging the source and drain wells at the bottoms thereof to the semiconductor substrate.

3. The method for manufacturing an electrostatic discharge protection structure as claimed in claim 1 wherein the steps of:

forming the shallow trench isolation forms source and drain openings therein; and forming the source and drain contact structures forms the respective source and drain contact structures extending through the source and drain openings to respectively contact the source and drain diffusion regions.

4. The method for manufacturing an electrostatic discharge protection structure as claimed in claim 1 wherein the step of:

forming the source and the drain wells forms the source and drain wells spaced proximate each other whereby the minimum value for efficient bipolar turn-on time is achieved.

5. A method for manufacturing an electrostatic discharge protection transistor comprising the steps of:

providing a semiconductor p-substrate;

forming a shallow trench opening in the semiconductor p-substrate;

implanting n+ source and n+ drain diffusion regions in the semiconductor p-substrate on both sides of the shallow trench opening;

implanting respective source and drain n-wells under the n+ source and n+ drain diffusion regions in the semiconductor p-substrate;

forming a shallow trench isolation over the semiconductor p-substrate and into the semiconductor p-substrate to separate the n+ source and n+ drain diffusion regions and portions of the source and drain n-wells; and forming source and drain contact structures respectively formed on the shallow trench isolation over the n+ source and n+ drain diffusion regions and extending through the shallow trench isolation to contact the n+ source and n+ drain diffusion regions.

6. The method for manufacturing an electrostatic discharge protection transistor as claimed in claim 5 including:

forming source and drain openings in the shallow trench isolation respectively open to the n+ source and n+ drain diffusion regions; and implanting a p− source and a p− drain implant respectively through the source and drain openings to individually bridge the source and drain n-wells to the semiconductor p-substrate.

7. The method for manufacturing an electrostatic discharge protection transistor as claimed in claim 5 wherein the steps of:

implanting the n+ source and n+ drain diffusion regions form regions having proximate and distal edges;

forming the shallow trench isolation forms source and drain contact openings therein between the proximate and distal edges of the n+ source and n+ drain diffusion regions and open thereto; and forming the source and drain contact structures form the source and drain contact structures respectively in through the source and drain contact openings to contact the n+ source and n+ drain diffusion regions.

8. The method for manufacturing an electrostatic discharge protection transistor as claimed in claim 5 wherein the step of:

implanting the source and the drain n-wells implants the source and drain n-wells spaced apart by the shallow trench isolation a portion of the depths thereof from a surface of the semiconductor p-substrate but proximate each other whereby the minimum value for efficient bipolar turn-on time is achieved and the snapback breakdown occurs distally from the surface of the semiconductor p-substrate.

* * * * *